(12) United States Patent
Wang et al.

(10) Patent No.: US 10,388,244 B2
(45) Date of Patent: Aug. 20, 2019

(54) DISPLAY PANEL AND DRIVING METHOD

(71) Applicant: AU OPTRONICS CORPORATION, Hsin-chu (TW)

(72) Inventors: Chun-Min Wang, Hsin-chu (TW); Lin-Chieh Wei, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 16 days.

(21) Appl. No.: 15/903,469

(22) Filed: Feb. 23, 2018

(65) Prior Publication Data

US 2018/0254016 A1 Sep. 6, 2018

(30) Foreign Application Priority Data

Mar. 3, 2017 (TW) ............................. 106107077 A

(51) Int. Cl.
*G11C 19/00* (2006.01)
*G09G 3/36* (2006.01)
*G11C 19/28* (2006.01)

(52) U.S. Cl.
CPC ............ *G09G 3/3688* (2013.01); *G09G 3/36* (2013.01); *G09G 3/3648* (2013.01); *G09G 3/3677* (2013.01); *G11C 19/28* (2013.01); *G09G 2300/0408* (2013.01); *G09G 2300/0426* (2013.01); *G09G 2310/027* (2013.01);
(Continued)

(58) Field of Classification Search
None
See application file for complete search history.

(56) References Cited

U.S. PATENT DOCUMENTS 7,215,332 B2 5/2007 Miyazawa
8,031,827 B2 * 10/2011 Tsai ..................... G11C 19/28
377/64

(Continued)

FOREIGN PATENT DOCUMENTS

TW 567452 B 12/2003
TW 201035940 A 10/2010
TW 201112211 A 4/2011

OTHER PUBLICATIONS

European Search Report issued by the European Patent Office dated Jul. 9, 2018 for application No. 18159659.4.
(Continued)

*Primary Examiner* — Tuan T Lam
(74) *Attorney, Agent, or Firm* — Tim Tingkang Xia, Esq.; Locke Lord LLP

(57) ABSTRACT

A display panel includes multiple gate lines and a gate driver. The gate driver includes multiple shift registers. Each of the shift registers includes a pull-up circuit, a driving circuit, and a pull-down circuit. The pull-up circuit charges a first node in the shift register. The driving circuit is coupled to the first node, and outputs, according to a voltage signal of the first node, a driving pulse signal to a corresponding gate line. The pull-down circuit is coupled to the driving circuit, and discharges one of the gate lines according to the voltage signal of the first node. The shift register includes a first shift register provided on a first side and a second shift register provided on a second side. The pull-down circuit in the first shift register discharges a gate line corresponding to the second shift register according to the voltage signal of the first node.

16 Claims, 6 Drawing Sheets

(52) U.S. Cl.
CPC ............... *G09G 2310/0267* (2013.01); *G09G 2310/0286* (2013.01)

(56) References Cited

U.S. PATENT DOCUMENTS

| | | | | |
|---|---|---|---|---|
| 8,160,198 | B2* | 4/2012 | Tsai | ................ G09G 3/3677 377/64 |
| 8,422,620 | B2 | 4/2013 | Su et al. | |
| 8,552,961 | B2* | 10/2013 | Yang | ................ G11C 19/184 345/100 |
| 8,811,567 | B2 | 8/2014 | Wu et al. | |
| 9,123,310 | B2* | 9/2015 | Choi | ................ G09G 3/3696 |
| 2006/0007085 | A1* | 1/2006 | Kim | ................ G09G 3/3677 345/87 |
| 2006/0061535 | A1* | 3/2006 | Kim | ................ G09G 3/3677 345/98 |
| 2007/0132700 | A1 | 6/2007 | Cho et al. | |
| 2010/0238143 | A1 | 9/2010 | Liu et al. | |
| 2010/0245301 | A1* | 9/2010 | Shang | ................ G09G 3/3677 345/204 |
| 2011/0221721 | A1* | 9/2011 | Tsou | ................ G09G 3/20 345/206 |
| 2012/0306844 | A1* | 12/2012 | Abe | ................ G11C 19/28 345/212 |
| 2015/0161958 | A1* | 6/2015 | Hsu | ................ G09G 3/3674 345/99 |
| 2015/0340102 | A1* | 11/2015 | Qian | ................ G11C 19/184 377/54 |
| 2015/0356909 | A1* | 12/2015 | Lim | ................ H03K 17/162 345/205 |
| 2016/0189794 | A1* | 6/2016 | Lou | ................ G11C 19/28 345/214 |
| 2016/0358571 | A1* | 12/2016 | Yu | ................ G11C 19/184 |
| 2017/0285375 | A1* | 10/2017 | Iwase | ................ G02F 1/133 |
| 2018/0226039 | A1* | 8/2018 | Han | ................ G09G 3/3648 |

OTHER PUBLICATIONS

Office Action issued by the State Intellectual Property Office of the Peoples Republic of China dated Feb. 28, 2019 for Application No. CN201710303477.0.

* cited by examiner

DISPLAY PANEL AND DRIVING METHOD

CROSS-REFERENCE TO RELATED PATENT APPLICATION

This non-provisional application claims priority to and the benefit of, pursuant to 35 U.S.C. § 119(a), patent application Ser. No. 106107077 filed in Taiwan on Mar. 3, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The content of the present disclosure relates to a display panel, and particularly to a display panel with a gate driver on array (GOA) driving architecture.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Recently, various products of liquid crystal displays are quite common. In current product specifications, resolution and sizes need to be increasingly increased, and bezels need to be increasingly narrowed. In this case, a conventional gate driver on array (GOA) driving architecture also faces a problem that wiring under a narrow bezel becomes more difficult, and consequently, the needed specifications can hardly be achieved.

On another aspect, it is known that if a display panel with a GOA driving architecture is used, discharge time is inconsistent due to limitation by a signal difference between a front end and a tail end of a drive wire, and consequently a problem of bright and dark lines on a displayed image is generated.

Therefore, how to improve an architecture of the display panel, and reduce the signal difference between the front end and the tail end of the drive wire, so as to resolve the problem of bright and dark lines is really one of important problems that need to be researched and developed currently, and also becomes a target to be improved in the current related field.

SUMMARY

An aspect of the content of the present disclosure is a display panel. The display panel includes a plurality of gate lines and a gate driver. The gate driver includes a plurality of shift registers. Each of the shift registers includes a pull-up circuit, a driving circuit, and a first pull-down circuit. The pull-up circuit is configured to charge a first node in the shift register. The driving circuit is electrically coupled to the first node, and is configured to output, according to a voltage signal of the first node, a driving pulse signal to a gate line corresponding to the shift register. The first pull-down circuit is electrically coupled to the driving circuit at the first node, and is configured to discharge one of the gate lines according to the voltage signal of the first node. The shift registers include a first shift register provided on a first side of the display panel, and a second shift register provided on a second side, opposite to the first side, of the display panel. The first pull-down circuit in the first shift register discharges a gate line corresponding to the second shift register according to the voltage signal of the first node, where each of the gate lines receives the driving pulse signal from only one of these shift registers to perform driving.

Another aspect of the content of the present disclosure is a driving method for a display panel. The display panel includes a plurality of gate lines, a first shift register provided on a first side, and a second shift register provided on a second side different from the first side. The driving method includes: charging, by a pull-up circuit in the first shift register, a first node in the first shift register; outputting, by a driving circuit in the first shift register, a driving pulse signal to a gate line corresponding to the first shift register according to a voltage signal of the first node; and discharging, by a first pull-down circuit in the first shift register, a gate line corresponding to the second shift register according to the voltage signal of the first node, where each of the gate lines receives the driving pulse signal from only one of the first shift register or the second shift register to perform driving.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
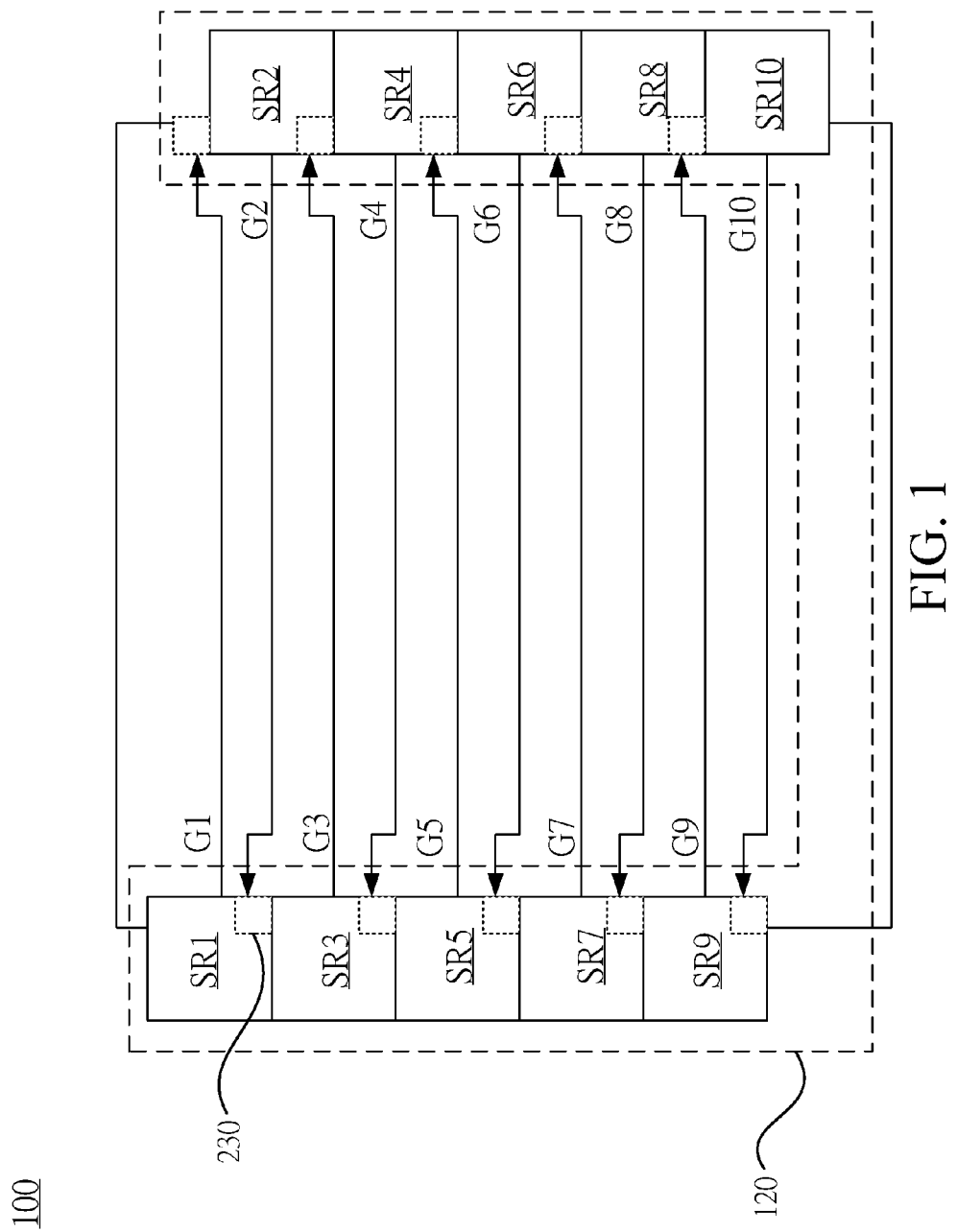
FIG. 1 is a schematic diagram of a display panel drawn according to some embodiments of the content of the present disclosure.

Embodiments accompanied with figures are described in detail below to better understand aspects of the content of the present disclosure. However, the embodiments provided are not intended to limit the scope of the present disclosure. The description of structures and operations are not intended to limit the order of execution. Any structure formed by recombining elements shall fall within the scope of the present disclosure as long as an equivalent apparatus can be generated. In addition, according to standards and common practice in the industry, the figures are merely provided for the purpose of supporting description, but are not drawn to scale. Actually, sizes of various features can be arbitrarily increased or reduced to facilitate description. Like elements are denoted by like reference numerals in the following description to facilitate understanding.

Terms in the whole description and claims, unless being particularly noted, often have general meanings of each term used in this field, in the content of the present disclosure, and in special contents. Some terms used for describing the present disclosure are discussed below or somewhere else in this description, so as to provide additional guidance related to the description of the present disclosure for a person of ordinary skill in the art.

In addition, the terms "comprise", "include", "have", and "contain" as used herein are all open terms, that is, mean "including but not limited to". In addition, the term "and/or" as used herein includes any one or all combinations of related listed objects.

In this specification, when an element is referred to as "being connected to" or "being coupled to", it may mean "being electrically connected" or "being electrically coupled". "Connection" or "coupling" may also be used to indicate that two or more elements co-operate or interact with each other. In addition, although terms "first", "second", and the like are used in this specification to describe different elements, these terms are used only to distinguish between similar elements or operations. Unless clearly indicated in the context, the terms neither are necessarily for describing or implying a sequence or a rank, nor are used to limit the present invention.

Referring to FIG. 1, FIG. 1 is a schematic diagram of a display panel 100 drawn according to some embodiments of the content of the present disclosure. As shown in FIG. 1, in some embodiments, the display panel 100 uses a single-sided driving architecture. The display panel 100 includes a plurality of gate lines G1-G10 and a gate driver 120. The gate driver 120 includes a plurality of stages of shift registers SR1-SR10 which are configured to drive pixels corresponding to the gate lines G1-G10, respectively. In accordance with the embodiment, the gate lines G1-G10 receives driving pulses from a single side, but the invention is not limited thereto.

According to this embodiment, in the shift registers SR1-SR10, odd-numbered-stage shift registers SR1, SR3, SR5, SR7, and SR9 corresponding to odd-numbered rows of gate lines G1, G3, G5, G7, and G9 are provided on a first side of the display panel 100, and even-numbered-stage shift registers SR2, SR4, SR6, SR8, and SR10 corresponding to even-numbered rows of gate lines G2, G4, G6, G8, and G10 are provided on a second side, opposite to the first side, of the display panel 100.

Specifically, in the display panel 100 with the single-drive circuit architecture, pixels on the odd-numbered rows of gate lines G1, G3, G5, G7, and G9 are driven by the shift registers SR1, SR3, SR5, SR7, and SR9 provided on the first side, respectively. Similarly, pixels on the even-numbered rows of gate lines G2, G4, G6, G8, and G10 are driven by the shift register SR2, SR4, SR6, SR8, and SR10 provided on the second side, respectively. In other words, a gate line of the gate lines G1-G10 receives a driving pulse signal from only one of the shift registers SR1-SR10 to perform driving, and pixels on gate lines in a same row are driven along a single direction on one side of the display panel 100.

In some embodiments, when the gate driver 120 discharges the gate lines G1-G10, the odd-numbered-stage shift registers SR1, SR3, SR5, SR7, and SR9 may discharge the gate lines G2, G4, G6, G8, and G10 corresponding to the even-numbered-stage shift registers SR2, SR4, SR6, SR8, and SR10. Similarly, the even-numbered-stage shift registers SR2, SR4, SR6, SR8, and SR10 may discharge the gate lines G1, G3, G5, G7, and G9 corresponding to the odd-numbered-stage shift registers SR1, SR3, SR5, SR7, and SR9. Specifically, the shift registers SR1-SR10 may discharge the gate lines G1-G10 by a pull-down circuit 230 thereof. The following paragraphs describe the specific circuit structures and related operations of the shift registers SR1-SR10 with reference to the accompanying drawings.

Figure 2:
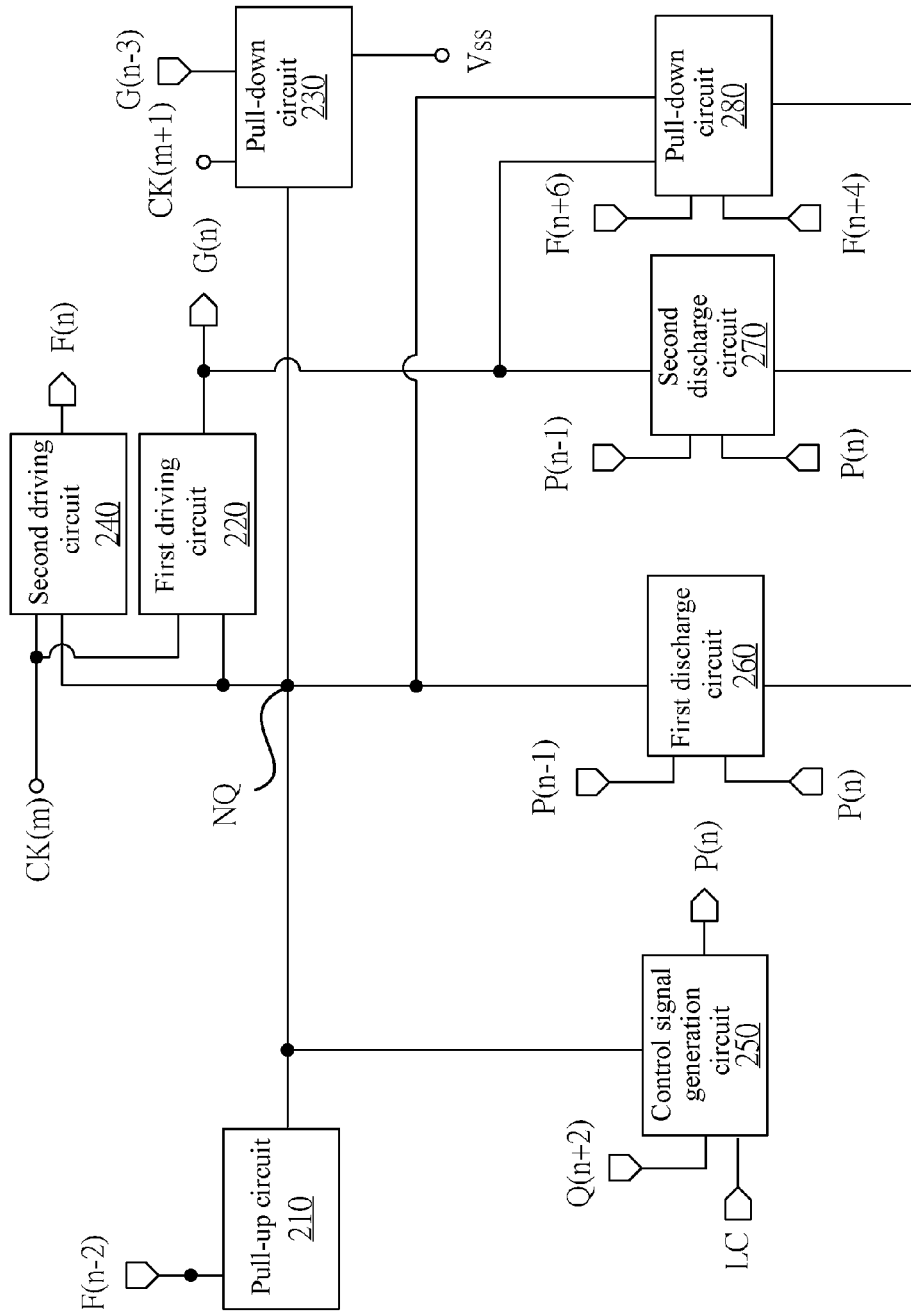
FIG. 2 is a schematic diagram of a shift register drawn according to some embodiments of the content of the present disclosure.

Referring to FIG. 2, FIG. 2 is a schematic diagram of a shift register 200 drawn according to some embodiments of the content of the present disclosure. In some embodiments, the shift register 200 may be configured to implement one of the multiple stages of shift registers SR1-SR10 drawn in FIG. 1.

As shown in FIG. 2, in some embodiments, the shift register 200 includes a pull-up circuit 210, a first driving circuit 220, a pull-down circuit 230, a second driving circuit 240, a control signal generation circuit 250, a first discharge circuit 260, a second discharge circuit 270, and a pull-down circuit 280.

In some embodiments, the pull-up circuit 210 is electrically connected to a node NQ in the shift register 200, so as to charge the node NQ in the shift register 200. Specifically, in some embodiments, the pull-up circuit 210 is configured to receive a control signal F(n−2) corresponding to an another-stage shift register 200, and charge the node NQ according to the control signal F(n−2). For example, the pull-up circuit 210 may charge the node NQ according to a control signal F(n−2) corresponding to a two-stage-preceding shift register 200. In addition, the pull-up circuit 210 does not continuously charge the node NQ in the shift register 200, and only needs to charge the node NQ within a particular time interval.

In some embodiments, the first driving circuit 220 is electrically coupled to the node NQ and a corresponding one of the gate lines G1-G10, and is configured to output, according to a voltage signal Q(n) of the node NQ, a driving pulse signal G(n) to the gate lines G1-G10 corresponding to the shift register 200. In this way, various stages of shift registers 200 may output, through a respective first driving circuit 220, the driving pulse signal G(n) to the corresponding gate lines G1-G10, so as to drive pixels corresponding thereto. Specifically, in some embodiments, when the voltage signal Q(n) at the node NQ is on an enabling level, the first driving circuit 220 may cooperate with a frequency signal CK(m) to output the driving pulse signal G(n).

In some embodiments, the pull-down circuit 230 is electrically coupled, at the node NQ, to the first driving circuit 220 and the pull-up circuit 210, and is electrically coupled to a reference voltage Vss. The pull-down circuit 230 is configured to discharge one of the gate lines G1-G10 according to the voltage signal Q(n) of the node NQ. Specifically, the pull-down circuit 230 in the shift register 200 provided on a first side is configured to discharge the gate lines G1-G10 corresponding to the shift register 200 provided on a second side. Similarly, the pull-down circuit 230 in the shift register 200 provided on the second side is configured to discharge the gate lines G1-G10 corresponding to the shift register 200 provided on the first side.

For example, in the embodiment shown in FIG. 2, each stage of pull-down circuit 230 is electrically coupled to a three-stage-preceding gate line. In other words, in FIG. 1, the pull-down circuit 230 of the shift register SR4 corresponding to the gate line G4 is electrically coupled to the gate line G1, and the pull-down circuit 230 of the shift register SR5 corresponding to the gate line G5 is electrically coupled to the gate line G2, and so on. In this way, pull-down circuits 230 in the odd-numbered-stage shift registers 200 may discharge, according to the voltage signal Q(n) of the node NQ in the shift registers 200, the even-numbered rows of gate lines G2, G4, G6, G8, and G10 corresponding to the even-numbered-stage shift registers 200; and the pull-down circuits 230 in the even-numbered-stage shift registers 200 may discharge, according to the voltage signal Q(n) of the node NQ in the shift registers 200, the odd-numbered rows of gate lines G1, G3, G5, G7, and G9 corresponding to the odd-numbered-stage shift registers 200.

Specifically, in some embodiments, for an Nth-stage shift register 200, when the voltage signal Q(n) of the node NQ of the shift register 200 is on the enabling level, the pull-down circuit 230 discharges a corresponding (N-3)th gate line according to a frequency signal CK(m+1), so as to pull down a driving pulse signal G(n-3) on the corresponding (N-3)th gate line. In other words, the pull-down circuit 230 of an (N+3)th-stage shift register 200 of the various stages of shift registers 200 is configured to discharge a corresponding Nth-stage gate line, so as to pull down the driving pulse signal G(n) of the corresponding (N-3)th gate line.

In some embodiments, the second driving circuit 240 in the shift register 200 is electrically coupled to the node NQ. The second driving circuit 240 is configured to output a corresponding control signal F(n) according to the voltage signal Q(n) of the node NQ. In this way, the control signal F(n) may be output from the shift register 200 to an another-stage shift register 200 for corresponding control. For example, as shown in FIG. 2, in some embodiments, for the Nth-stage shift register 200, the pull-up circuit 210 charges the node NQ according to the control signal F(n−2) corresponding to the two-stage-preceding (i.e., an (N-2)th stage) shift register 200. In addition, the Nth-stage shift register 200 may also output the control signal F(n) to an another-stage shift register 200, so that the another-stage shift register 200 may control the voltage signal Q(n) of the node NQ thereof by means of the pull-down circuit 280 thereof, or control discharging of a gate line corresponding thereto by means of the pull-down circuit 280 thereof.

In some embodiments, the control signal generation circuit 250 in the shift register 200 is electrically coupled to the node NQ. The control signal generation circuit 250 is configured to output a control signal P(n) according to the voltage signal Q(n) of the node NQ of the shift register 200 and a voltage signal Q(n+2) of a node NQ of a two-stage-subsequent (i.e., an (N+2)th stage) shift register 200. Specifically, the Nth-stage shift register 200 may output the control signal P(n) to the another-stage shift register 200, so that the another-stage shift register 200 may control the voltage signal Q(n) of the node NQ thereof by means of the first discharge circuit 260 thereof, or control discharging of a gate line corresponding thereto by means of the second discharge circuit 270 thereof.

For example, in some embodiments, the first discharge circuit 260 in the shift register 200 is electrically coupled to the node NQ, and may discharge the node NQ according to a previous-stage control signal P(n−1) or a this-stage control signal P(n). In addition, in some embodiments, the second discharge circuit 270 in the shift register 200 is electrically coupled to an output end of the first driving circuit 220, and is configured to discharge the gate line corresponding to the shift register 200 according to the previous-stage control signal P(n−1) or the this-stage control signal P(n).

In some embodiments, the first discharge circuit 260 and the second discharge circuit 270 are electrically coupled to a reference voltage VGL, so as to discharge the node NQ or a corresponding gate line, respectively.

In addition, in some embodiments, the node NQ is coupled to the pull-down circuit 280 in the shift register 200, and the output end of the first driving circuit 220 is electrically coupled to the pull-down circuit 280 in the shift register 200. In this way, the pull-down circuit 280 may be configured to discharge the node NQ or the gate line corresponding to the shift register 200 according to a six-stage-subsequent control signal F(n+6) and a four-stage-subsequent control signal F(n+4), respectively.

In this way, by means of corresponding operations of the pull-up circuit 210, the first discharge circuit 260, and the pull-down circuit 280, the voltage signal Q(n) of the node NQ in the shift register 200 may be operated on a corresponding enabling or disabling level according to the control signal F(n−2), the control signal P(n−1), the control signal P(n), and the control signal F(n+6). In this way, the first driving circuit 220 in the shift register 200 may output, according to the voltage signal Q(n) of the node NQ, the driving pulse signal G(n) to the corresponding gate lines G1-G10. The control signal generation circuit 250 may also output the control signal P(n) according to the voltage signal Q(n) of the node NQ, so as to correspondingly control operations of shift registers 200 at other stages.

When the corresponding gate line of the shift register 200 is discharged, in addition to that the second discharge circuit 270 discharges according to the control signal P(n−1) and the control signal P(n), and the pull-down circuit 280 discharges according to the control signal F(n+4), the pull-down circuit 230 in an another-stage (for example: three-stage-subsequent) shift register 200 on a corresponding side thereof may also discharge the corresponding gate line according to the frequency signal CK(m+1). In this way, discharging a same gate line by shift registers 200 on both sides at the same time can be implemented under an array substrate column driving architecture. In this way, a front end and a tail end of each gate line in the display panel 100 have same effects of discharging by pulling down, so as to avoid a phenomenon of bright and dark lines caused by a discharging difference that is between the two ends and is caused by discharging by a discharging element on a single side.

In addition, a circuit area of the shift register 200 may further be reduced and overall consumed power of the gate driver may be reduced by integrating the pull-down circuit 230 into a shift register 200 on an opposite side to perform discharge.

Figure 3:
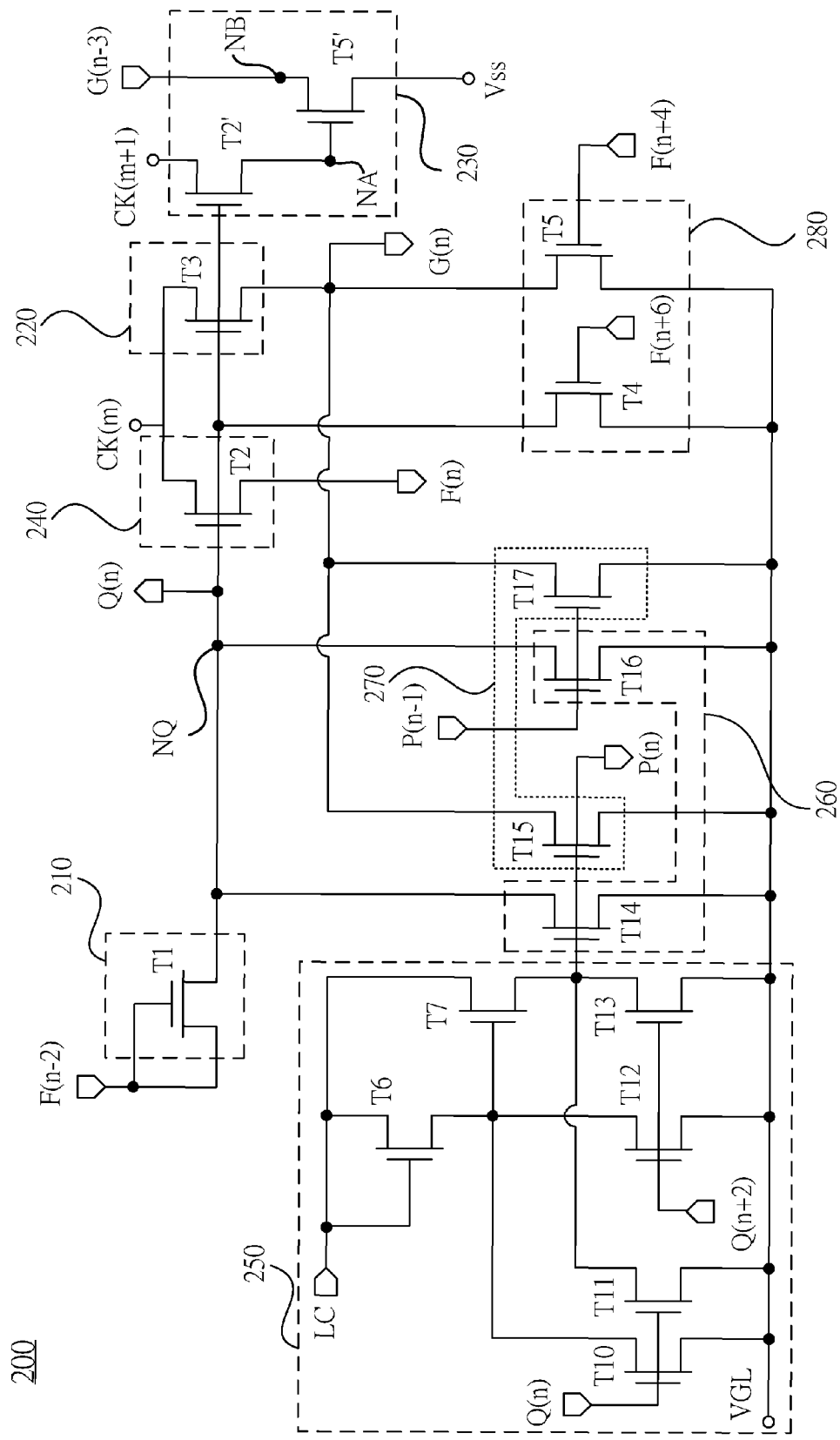
FIG. 3 is a specific circuit diagram of a shift register drawn according to some embodiments of the content of the present disclosure.

Referring to FIG. 3, FIG. 3 is a specific circuit diagram of a shift register 200 drawn according to some embodiments of the content of the present disclosure. In FIG. 3, similar elements related to the embodiment of FIG. 2 are denoted by like reference numerals to facilitate understanding. Moreover, specific principles of the similar elements are described in detail in the foregoing paragraphs, and details are not described herein again unless the elements have cooperative operating relationships with the elements in FIG. 2 and need to be introduced.

As shown in FIG. 3, in some embodiments, a pull-up circuit 210 includes a transistor T1. In an embodiment, a first end and a control end of the transistor T1 are electrically coupled to each other, and are configured to receive a control signal F(n−2) output by a two-stage-preceding shift register 200. Moreover, the first end and the control end of the transistor T1 may also not be directly connected, and may also receive different signals, respectively. The content of the present disclosure is not limited thereto. A second end of the transistor T1 is electrically coupled to a node NQ. In this way, the transistor T1 may control, according to the control signal F(n−2), the node NQ to be on an enabling level.

In addition, as shown in FIG. 3, in some embodiments, a first driving circuit 220 includes a transistor T3. In structure, a first end of the transistor T3 is configured to receive a frequency signal CK(m). A second end of the transistor T3 is electrically coupled to a corresponding gate line, and is configured to output a driving pulse signal G(n). A control end of the transistor T3 is electrically coupled to the node NQ. In this way, when a voltage signal Q(n) of the node NQ is on the enabling level, the transistor T3 is correspondingly conducted, and the driving pulse signal G(n) is output according to the frequency signal CK(m).

Similarly, as shown in FIG. 3, in some embodiments, a second driving circuit 240 includes a transistor T2. In structure, a first end of the transistor T2 is configured to receive the frequency signal CK(m). A second end of the transistor T2 is configured to output a control signal F(n). A control end of the transistor T2 is electrically coupled to the node NQ. In this way, when the voltage signal Q(n) at the node NQ is on the enabling level, the transistor T2 is correspondingly conducted, and the control signal F(n) is output according to the frequency signal CK(m). Specifically, in some embodiments, when the driving pulse signal G(n) is on the enabling level, the control signal F(n) is also on the enabling level. Similarly, when the driving pulse signal G(n) is on a disabling level, the control signal F(n) is also on the disabling level.

In addition, as shown in FIG. 3, in some embodiments, a pull-down circuit 230 includes a transistor T2' and a transistor T5'. In structure, a first end of the transistor T2' is configured to receive a frequency signal CK(m+1), and a control end thereof is electrically coupled to the node NQ. A first end of the transistor T5' is electrically coupled to a corresponding one of the gate lines G1-G10, a second end of the transistor T5' is configured to receive a reference voltage Vss, and a control end of the transistor T5' is electrically coupled to the second end of the transistor T2'.

In this way, when the voltage signal Q(n) of the node NQ is on the enabling level, the transistor T2' is correspondingly conducted, and the frequency signal CK(m+1) is provided to the control end of the transistor T5' by means of the transistor T2'. When the frequency signal CK(m+1) is on the enabling level, the transistor T5' is correspondingly conducted, and the pull-down circuit 230 may pull down a corresponding gate line to the reference voltage Vss, so as to implement discharging on the corresponding gate line. In some embodiments, the pull-down circuit 230 is switched on or off by means of the transistor T2' according to the voltage signal Q(n) of the node NQ, so as to selectively transmit the frequency signal CK(m+1) to the control end of the transistor T5'. Therefore, overall consumed power of the pull-down circuit 230 may be further reduced, so that power consumed by the shift register 200 is also reduced.

Figure 4:
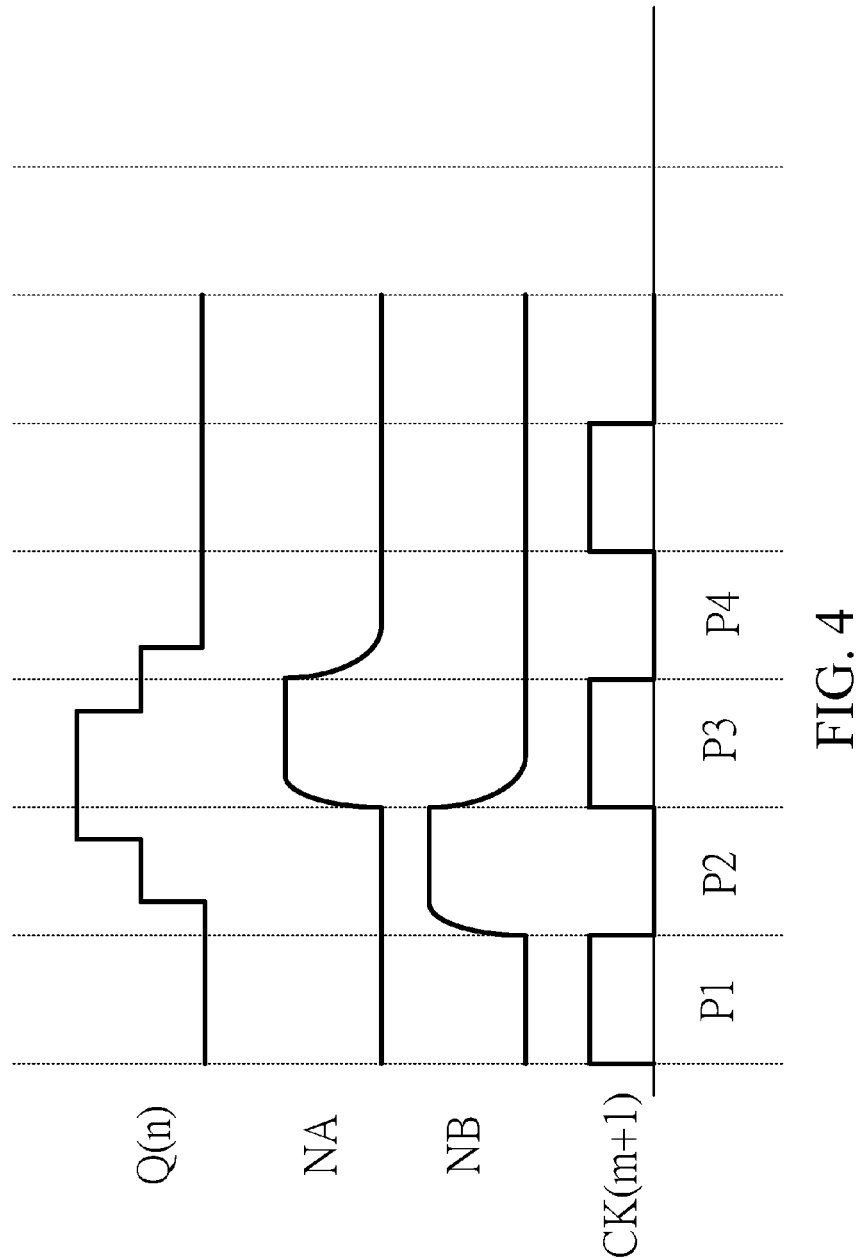
FIG. 4 is a voltage waveform graph drawn according to some embodiments of the content of the present disclosure.

Referring to FIG. 4 at the same time, FIG. 4 is a voltage waveform graph drawn according to some embodiments of the content of the present disclosure. For ease and clarity of description, the voltage waveform drawn in FIG. 4 is described with reference to the embodiment shown in FIG. 3, but the present invention is not limited thereto. In FIG. 4, similar elements related to the embodiment of FIG. 3 are denoted by like reference numerals to facilitate understanding.

As shown in FIG. 4, in the embodiment shown in FIG. 3, during a period P1, the voltage signal Q(n) of the node NQ is on a low level. During periods P2-P4, the voltage signal Q(n) of the node NQ in the shift register 200 is double boosted to generate a voltage signal to the control end of the transistor T2'. When the voltage signal Q(n) of the node NQ is on the enabling level to make the transistor T2' conducted, the frequency signal CK(m+1) may be correspondingly transmitted to the second end of the transistor T2' and the control end of the transistor T5' (i.e., a node NA).

During the period P2, a voltage level of the node NB is high corresponding to a driving pulse signal G(n−3) of a three-stage-preceding gate line. At the moment, because the frequency signal CK(m+1) is on the disabling level, the voltage level of the node NA is also on the disabling level, so as to keep the transistor T5' being switched off.

During the period P3, the voltage signal Q(n) and the frequency signal CK(m+1) are simultaneously on the enabling level, and a voltage level of the node NA is correspondingly raised to the enabling level, so that the transistor T5' is conducted. At the moment, the voltage level of the node NB (i.e.: the corresponding gate line) may be pulled down to a low level of the reference voltage Vss. In this way, the pull-down circuit 230 may implement discharging of the driving pulse signal G(n−3) on the corresponding gate line.

Referring to FIG. 3 again, in the embodiment shown in FIG. 3, the control signal generation circuit 250 includes transistors T6, T7, and T10-T13. In structure, a first end and a control end of the transistor T6 are electrically coupled to each other, so as to receive a low-frequency control signal LC. A first end of the transistor T7 is coupled to the first end of the transistor T6. A second end of the transistor T7 is configured to output the control signal P(n) according to the low-frequency control signal LC. A control end of the transistor T7 is coupled to a second end of the transistor T6. A first end of the transistor T10 is coupled to the second end of the transistor T6.

A second end of the transistor T10 is configured to receive the reference voltage VGL. A control end of the transistor T10 is coupled to the node NQ. A first end of the transistor T11 is coupled to the second end of the transistor T7. A second end of the transistor T11 is configured to receive the reference voltage VGL. A control end of the transistor T11 is electrically coupled to the node NQ. A first end of the transistor T12 is coupled to the second end of the transistor T6. A second end of the transistor T12 is configured to receive the reference voltage VGL. A control end of the transistor T12 is coupled to the node NQ in a two-stage-subsequent shift register 200, so as to receive the voltage signal Q(n+2). A first end of the transistor T13 is coupled to the second end of the transistor T7. A second end of the transistor T13 is configured to receive the reference voltage VGL. A control end of the transistor T13 is coupled to the node NQ in the two-stage-subsequent shift register 200, so as to receive the voltage signal Q(n+2).

In this way, by means of interactive operations of the transistors T6, T7, and T10-T13, the control signal generation circuit 250 may generate and output the corresponding control signal P(n) according to the voltage signal Q(n) of the node NQ and the voltage signal Q(n+2) of the node NQ in the two-stage-subsequent shift register 200, so as to correspondingly control the first discharge circuit 260 and the second discharge circuit 270 in the shift register 200. Specifically, in some embodiments, the control signal P(n) output by the shift register 200 may be used to control the first discharge circuit 260 and the second discharge circuit 270 in a next-stage shift register 200.

In the embodiment shown in FIG. 3, the first discharge circuit 260 electrically coupled between the node NQ and the reference voltage VGL includes a transistor T14 and a transistor T16. As shown in the figure, in structure, a first end of the transistor T14 is coupled to the node NQ. A second end of the transistor T14 is configured to receive the reference voltage VGL. A control end of the transistor T14 is coupled to the second end of the transistor T7. A first end of the transistor T16 is electrically coupled to the node NQ, a second end of the transistor T16 is electrically coupled to the reference voltage VGL, and a control end of the transistor T16 is configured to receive the control signal P(n−1) output by a previous-stage shift register 200. In this way, the transistor T14 may be configured to determine, according to the control signal P(n) corresponding to the shift register 200, whether to discharge the node NQ; and the transistor T16 may be configured to determine, according to the control signal P(n−1) of the previous-stage shift register 200, whether to discharge the node NQ. Specifically, when the control signal P(n) is on the enabling level, the transistor T14 is conducted, so as to implement discharging on the node NQ. When the control signal P(n−1) is on the enabling level, the transistor T16 is conducted, so as to discharge the node NQ.

In addition, in the embodiment shown in FIG. 3, the second discharge circuit 270 electrically coupled between a corresponding gate line (i.e.: the second end of the transistor T3) and the reference voltage VGL includes a transistor T15 and a transistor T17. As shown in the figure, in structure, a first end of the transistor T15 is coupled to the second end of the transistor T3 (i.e.: being coupled to the corresponding gate line). A second end of the transistor T15 is configured to receive the reference voltage VGL. A control end of the transistor T15 is coupled to the second end of the transistor T7. A first end of the transistor T17 is electrically coupled to a corresponding gate line, a second end of the transistor T17 is electrically coupled to the reference voltage VGL, and a control end of the transistor T17 is configured to receive the control signal P(n−1) output by the previous-stage shift register 200. In this way, the transistor T15 may be configured to determine, according to the control signal P(n) corresponding to the shift register 200, whether to discharge the driving pulse signal G(n) on the corresponding gate line; and the transistor T17 may be configured to determine, according to the control signal P(n−1) of the previous-stage shift register 200, whether to discharge the driving pulse signal G(n) on the corresponding gate line. Specifically, when the control signal P(n) is on the enabling level, the transistor T15 is conducted, so as to implement discharging of the driving pulse signal G(n) on the corresponding gate line. When the control signal P(n−1) is on the enabling level, the transistor T17 is conducted, so as to implement discharging of the driving pulse signal G(n) on the corresponding gate line.

In addition, in the embodiment shown in FIG. 3, the pull-down circuit 280 electrically coupled between the node NQ, a corresponding gate line (i.e.: the second end of the transistor T3), and the reference voltage VGL includes a transistor T4 and a transistor T5. Similarly, in structure, a first end of the transistor T4 is electrically coupled to the node NQ, a second end of the transistor T4 is electrically coupled to the reference voltage VGL, and a control end of the transistor T4 is configured to receive the control signal F(n+6) output by a six-stage-subsequent shift register 200. In this way, the transistor T4 may be configured to determine, according to the control signal F(n+6) corresponding to the six-stage-subsequent shift register 200, whether to discharge the node NQ. Specifically, when the control signal F(n+6) is on the enabling level, the transistor T4 is conducted, so as to implement discharging on the node NQ. Similarly, in structure, a first end of the transistor T5 is electrically coupled to a corresponding gate line, a second end of the transistor T5 is electrically coupled to the reference voltage VGL, and a control end of the transistor T5 is configured to receive the control signal F(n+4) output by a four-stage-subsequent shift register 200. In this way, the transistor T5 may be configured to determine, according to the control signal F(n+4) corresponding to the four-stage-subsequent shift register 200, whether to discharge the driving pulse signal G(n) on the corresponding gate line. Specifically, when the control signal F(n+4) is on the enabling level, the transistor T5 is conducted, so as to implement discharging of the driving pulse signal G(n) of the corresponding gate line.

A person of ordinary skill in the art should understand that the specific circuit of the shift register 200 shown in FIG. 3 is only for illustrative description. In various embodiments, the pull-up circuit 210, the first driving circuit 220, the pull-down circuit 230, the second driving circuit 240, the control signal generation circuit 250, the first discharge circuit 260, the second discharge circuit 270, and the pull-down circuit 280 of the shift register 200 may all be designed according to actual requirements. Therefore, the content of the present disclosure is not limited to the circuit shown in FIG. 3.

Figure 5:
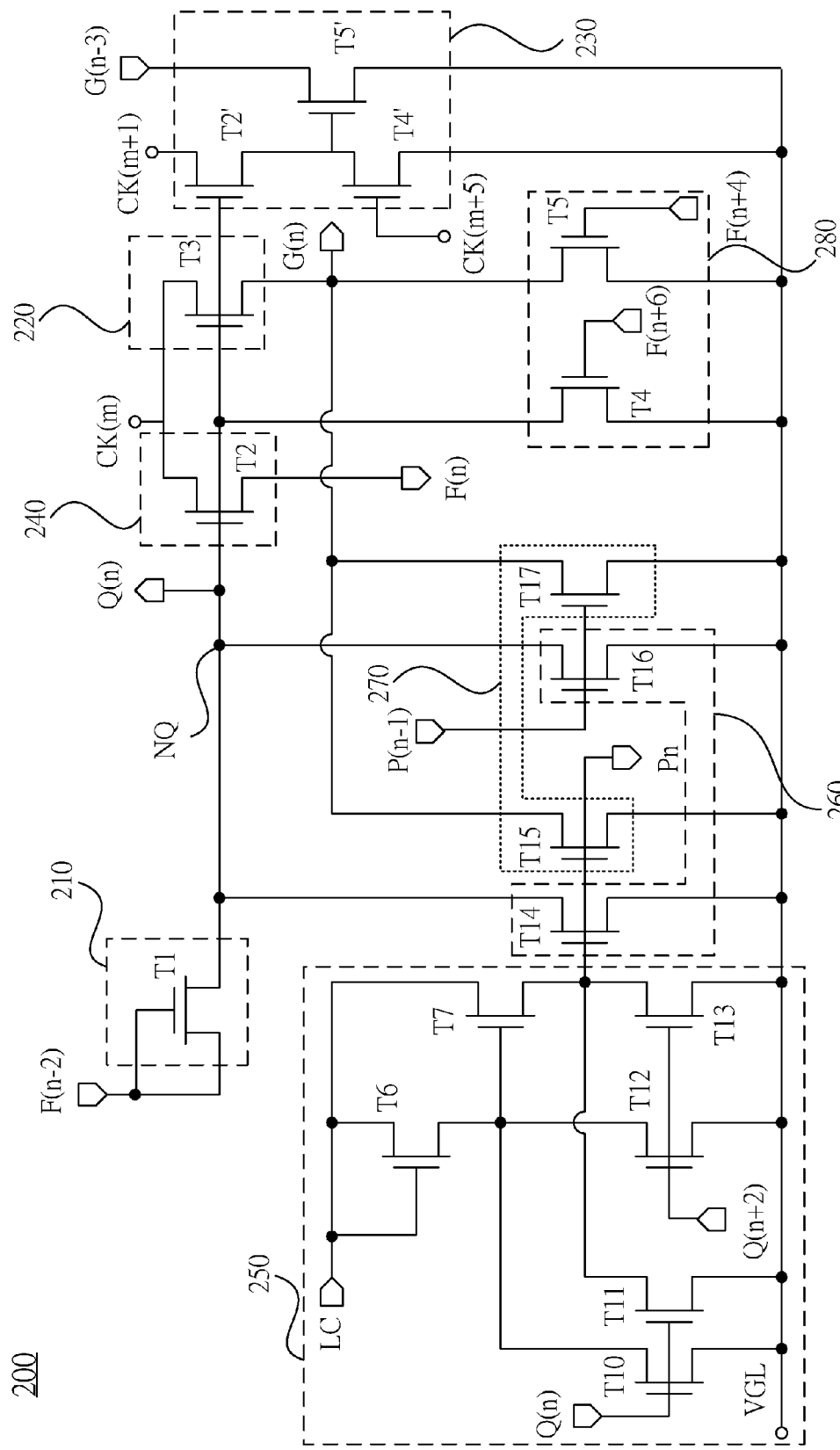
FIG. 5 is a specific circuit diagram of a shift register drawn according to some other embodiments of the content of the present disclosure.

Referring to FIG. 5, FIG. 5 is a specific circuit diagram of a shift register 200 drawn according to some other embodiments of the content of the present disclosure. In FIG. 5, similar elements related to the embodiment of FIG. 3 are denoted by like reference numerals to facilitate understanding. Moreover, specific principles of the similar elements are described in detail in the foregoing paragraphs, and details are not described herein again unless the elements have cooperative operating relationships with the elements in FIG. 3 and need to be introduced.

Compared with the embodiment drawn in FIG. 3, in the shift register 200 drawn in this embodiment, a pull-down circuit 230 further includes a transistor T4'. In structure, a first end of the transistor T4' is electrically coupled to a second end of a transistor T2'. A second end of the transistor T4' is electrically coupled to a reference voltage VGL. A control end of the transistor T4' is configured to receive a frequency signal CK(m+5). In addition, in this embodiment, the second end of the transistor T4' and a second end of a transistor T5' are electrically coupled to the reference voltage VGL. In this way, the pull-down circuit 230 may share the reference voltage VGL with other functional circuits in the shift register 200 to perform discharging without an additional independent reference voltage Vss. In this way, when a five-stage-subsequent frequency signal CK(m+5) is on an enabling level, the transistor T4' is correspondingly conducted to switch off the transistor T5', so as to ensure normal operations of the pull-down circuit 230. However, a person of ordinary skill in the art may determine a quantity and values of required reference voltages according to actual requirements. The present invention does not limit that the second end of the transistor T4' and the second end of the transistor T5' need to be electrically coupled directly.

In view of the above, a person of ordinary skill in the art should understand that the shift registers SR1-SR10 in the display panel 100 may be implemented by using a plurality of different specific circuits, and the specific circuits drawn in the foregoing embodiments are only one of the possible implementation manners of the content of the present disclosure, and are not intended to limit the content of the present disclosure.

Figure 6:
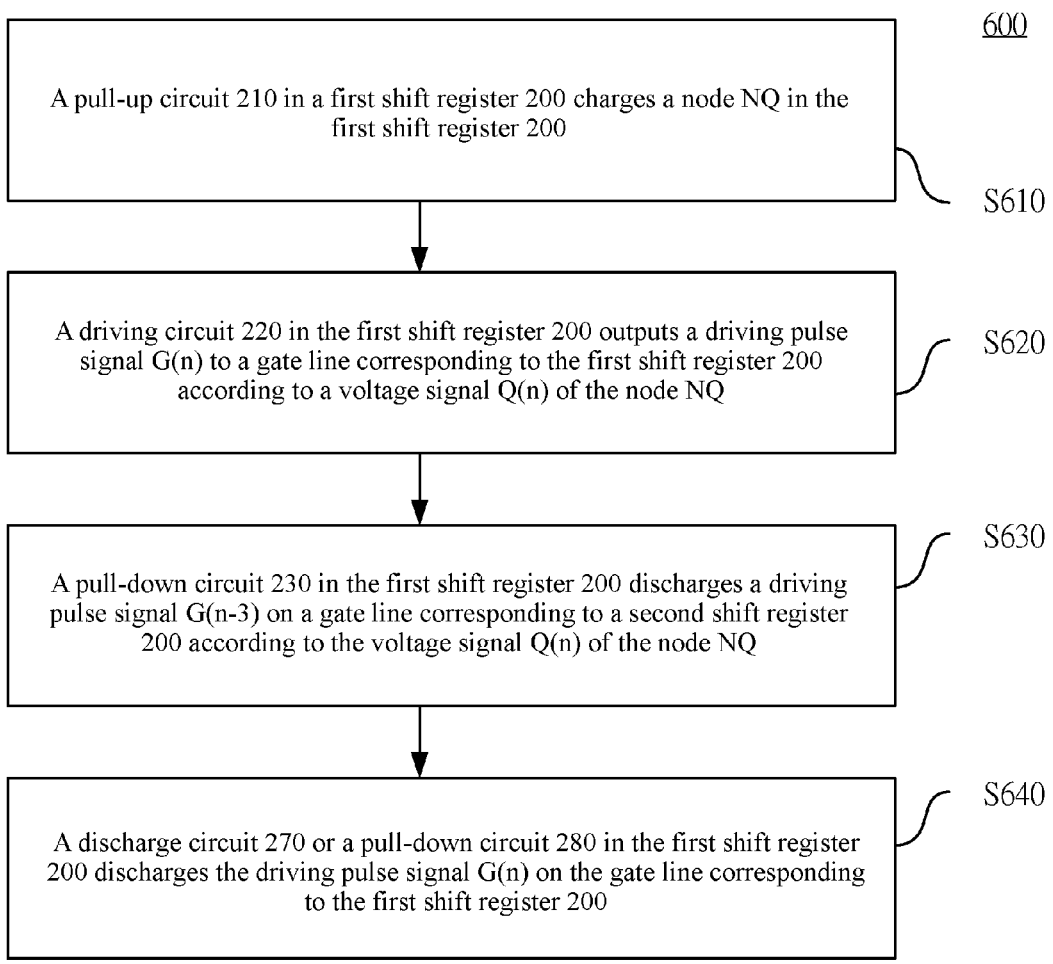
FIG. 6 is a flowchart of a driving method for a display panel drawn according to some embodiments of the content of the present disclosure.

Referring to FIG. 6, FIG. 6 is a flowchart of a driving method 600 for a display panel 100 drawn according to some embodiments of the content of the present disclosure. For ease and clarity of description, the following driving method 600 is described with reference to the embodiments shown in FIG. 1 to FIG. 5, but the present invention is not limited thereto. Any person skilled in the art may make various variations and modifications without departing from the spirit and scope of the content of the present disclosure. As shown in FIG. 6, the driving method 600 may include steps S610, S620, S630, and S640.

First, in step S610, a pull-up circuit 210 in a first shift register 200 (for example, an odd-numbered-stage shift register 200) charges a node NQ in the first shift register 200.

Subsequently, in step S620, a first driving circuit 220 in the first shift register 200 outputs a driving pulse signal G(n) to a gate line corresponding to the first shift register 200 according to a voltage signal Q(n) of the node NQ.

Subsequently, in step S630, a pull-down circuit 230 in the first shift register 200 discharges a driving pulse signal G(n−3) on a gate line corresponding to a second shift register 200 (for example, an even-numbered-stage shift register 200) according to the voltage signal Q(n) of the node NQ.

Specifically, in some embodiments, the step S630 further includes that when the voltage signal Q(n) of the node NQ of the first shift register 200 is on an enabling level, the driving pulse signal G(n−3) on the gate line corresponding to the second shift register 200 is discharged by using the pull-down circuit 230 of the first shift register 200 according to a frequency signal CK(m+1).

Next, in step S640, a second discharge circuit 270 or a pull-down circuit 280 in the first shift register 200 discharges the driving pulse signal G(n) on the gate line corresponding to the first shift register 200.

In this way, an odd-numbered-stage shift register 200 may discharge a drive signal on a gate line corresponding to an even-numbered-stage shift register 200.

Similarly, the even-numbered-stage shift register 200 may also discharge a drive signal on a gate line corresponding to the odd-numbered-stage shift register 200. In other words, for the gate lines G1-G10 drawn in FIG. 1, although pixels on gate lines in a same row are driven along a single direction from one side of the display panel 100, drive signals may be discharged at the same time by using two groups of shift registers 200 respectively corresponding to two sides of the display panel 100. In this way, front ends and tail ends of the gate lines G1-G10 may have same discharging effects, thereby avoiding a difference in display luminance on pixels driven by vertically adjacent gate lines that is caused by a difference in discharge time on the front ends and the tail ends. In this way, the phenomenon that is of bright and dark lines on the display panel 100 and is caused by the difference in display luminance may be improved.

A person of ordinary skill in the art may directly learn how the driving method 600 executes these operations and functions based on the display panel 100 and the shift registers 200 in the foregoing plurality of different embodiments. Therefore, details are not described herein again.

Although the method disclosed in this specification is shown and described as a series of steps or events, it should be understood that a sequence of these shown steps or events should not be explained to have a limitative meaning. For example, some steps may occur in different sequences and/or occur simultaneously with other steps or events than the steps or events shown and/or described in this specification. In addition, when one or more aspects or embodiments described in this specification are implemented, not all steps shown herein are needed. In addition, one or more steps in this specification may also be executed in one or more separated steps and/or phases.

In view of the above, according to the content of the present disclosure, by applying the display panel 100, the shift register 200, and the driving method 600 in the foregoing plurality of embodiments to drive pixels on gate lines G1-G10, discharging may be performed on two ends of the gate lines G1-G10 at the same time, thereby reducing a discharge time difference between the two ends of the gate lines G1-G10, so as to avoid generation of bright and dark lines. In addition, a circuit area may be reduced and the effect of reducing power consumption may be achieved by integrating the pull-down circuit 230 into a shift register 200 on an opposite side to perform discharge.

In each embodiment of the content of the present disclosure, elements such as the transistors T1-T17, T2', T4', and T5' may all be implemented by proper electronic circuit elements. In addition, various figures, embodiments, and features in the embodiments in the content of the present disclosure may be combined with the circuit when they do not conflict with each other. The circuits drawn in the figures are merely exemplary, are simplified to enable the description to be brief and easy to be understood, and are not intended to limit the content of the present disclosure.

The content of the present disclosure is disclosed through the foregoing implementation manners; however, these implementation manners are not intended to limit the content of the present disclosure. Various changes and modifications may be made by any person skilled in the art without departing from the spirit and scope of the present disclosure. Therefore, the protection scope of the content of the present disclosure is subject to the appended claims.

What is claimed is:

1. A display panel, comprising:
a plurality of gate lines; and
a gate driver, comprising a plurality of shift registers, wherein each of the shift registers comprises:
a pull-up circuit, configured to charge a first node in the shift register;
a driving circuit, electrically coupled to the first node, and configured to output, according to a voltage signal of the first node, a driving pulse signal to a gate line corresponding to the shift register; and
a first pull-down circuit, electrically coupled to the driving circuit at the first node, and configured to discharge one of the gate lines according to the voltage signal of the first node,
wherein the shift registers comprise a first shift register provided on a first side of the display panel, and a second shift register provided on a second side of the display panel opposite to the first side, and the first pull-down circuit in the first shift register discharges a gate line corresponding to the second shift register according to the voltage signal of the first node, wherein each of the gate lines receives the driving pulse signal from only one of the shift registers to perform driving.

2. The display panel according to claim 1, wherein in the shift registers, a plurality of odd-numbered-stage shift registers corresponding to odd-numbered rows of gate lines are provided on the first side, a plurality of even-numbered-stage shift registers corresponding to even-numbered rows of gate lines are provided on the second side, the first pull-down circuits in the odd-numbered-stage shift registers discharge the even-numbered rows of gate lines corresponding to the even-numbered-stage shift registers, and the first pull-down circuits in the even-numbered-stage shift registers discharge the odd-numbered rows of gate lines corresponding to the odd-numbered-stage shift registers.

3. The display panel according to claim 1, wherein when the voltage signal of the first node of the shift register is on an enabling level, the first pull-down circuit discharges one of the gate lines according to a first frequency signal.

4. The display panel according to claim 3, wherein the first pull-down circuit comprises:
a first transistor, comprising:
a first end, configured to receive the first frequency signal;
a second end; and
a control end, electrically coupled to the first node; and
a second transistor, comprising:
a first end, electrically coupled to one of the gate lines;
a second end; and
a control end, electrically coupled to the second end of the first transistor.

5. The display panel according to claim 4, wherein the first pull-down circuit further comprises:
a third transistor, comprising:
a first end, electrically coupled to the second end of the first transistor;
a second end; and
a control end, configured to receive a second frequency signal.

6. The display panel according to claim 1, wherein each of the shift registers further comprises:
a second driving circuit, configured to output a corresponding first control signal according to the voltage signal of the first node, the pull-up circuit charging the first node according to the first control signal corresponding to a two-stage-preceding shift register.

7. The display panel according to claim 1, wherein each of the shift registers further comprises:
a control signal generation circuit, configured to output a second control signal according to the voltage signal of the first node of the shift register and the voltage signal of the first node of a two-stage-subsequent shift register.

8. The display panel according to claim 1, wherein each of the shift registers further comprises a first discharge circuit, the first discharge circuit being configured to discharge the first node.

9. The display panel according to claim 8, wherein the first discharge circuit comprises:
a first transistor, configured to determine, according to a second control signal corresponding to a previous-stage shift register, whether to discharge the first node; and
a second transistor, configured to determine, according to a second control signal corresponding to a current-stage shift register, whether to discharge the first node.

10. The display panel according to claim 1, wherein each of the shift registers further comprises a second discharge circuit, the second discharge circuit being configured to discharge the gate line corresponding to the shift register.

11. The display panel according to claim 10, wherein the second discharge circuit comprises:
a third transistor, configured to determine, according to a second control signal corresponding to a previous-stage shift register, whether to discharge the gate line; and
a fourth transistor, configured to determine, according to a second control signal corresponding to a current-stage shift register, whether to discharge the gate line.

12. The display panel according to claim 1, wherein each of the shift registers further comprises a second pull-down circuit, the second pull-down circuit being configured to discharge the gate line and the first node, wherein the second pull-down circuit comprises:
a fifth transistor, configured to determine, according to a first control signal corresponding to a six-stage-subsequent shift register, whether to discharge the first node; and
a sixth transistor, configured to determine, according to a first control signal output by a fourth-stage-subsequent shift register, whether to discharge the gate line.

13. The display panel according to claim 1, wherein the first pull-down circuit in an (N+3)th-stage shift register in the shift registers is configured to discharge the driving pulse signal on the gate line corresponding to an Nth-stage shift register, wherein N is a positive integer.

14. A driving method for a display panel, wherein the display panel comprises a plurality of gate lines, a first shift register provided on a first side, and a second shift register provided on a second side different from the first side, the driving method comprising:
charging, by a pull-up circuit in the first shift register, a first node in the first shift register;
outputting, by a driving circuit in the first shift register, a driving pulse signal to a gate line corresponding to the first shift register according to a voltage signal of the first node; and
discharging, by a first pull-down circuit in the first shift register, a gate line corresponding to the second shift register according to the voltage signal of the first node, wherein each of the gate lines receives the driving pulse signal from only one of the first shift register or the second shift register to perform driving.

15. The driving method according to claim 14, further comprising:
when the voltage signal of the first node of the first shift register is on an enabling level, discharging, by the first pull-down circuit of the first shift register, the gate line corresponding to the second shift register according to a first frequency signal.

16. The driving method according to claim 14, further comprising:
discharging, by a discharge circuit or a second pull-down circuit in the first shift register, the gate line corresponding to the first shift register.

* * * * *